US008801150B2

(12) United States Patent
Hishinuma et al.

(10) Patent No.: US 8,801,150 B2

(45) Date of Patent: Aug. 12, 2014

(54) PIEZOELECTRIC DEVICE, PIEZOELECTRIC DEVICE MANUFACTURING METHOD, AND LIQUID DISCHARGE APPARATUS

(75) Inventors: Yoshikazu Hishinuma, Kanagawa-ken (JP); Takehiro Kasahara, Minamiashigara (JP); Yasukazu Nihei, Kanagawa-ken (JP); Takamichi Fujii, Kanagawa-ken (JP); Yuuichi Okamoto, Minamiashigara (JP); Takami Arakawa, Kanagawa-ken (JP); Takayuki Naono, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 858 days.

(21) Appl. No.: 13/000,408

(22) PCT Filed: Jul. 27, 2009

(86) PCT No.: PCT/JP2009/003529

§ 371 (c)(1), (2), (4) Date: Dec. 21, 2010

(87) PCT Pub. No.: WO2010/013438

PCT Pub. Date: Feb. 4, 2010

(65) Prior Publication Data

US 2011/0121096 A1 May 26, 2011

(30) Foreign Application Priority Data

Jul. 31, 2008 (JP) ................................ 2008-197456

(51) Int. Cl.

| | |
|---|---|
| ***H01L 41/18*** | (2006.01) |
| ***H01L 41/083*** | (2006.01) |
| ***H01L 41/04*** | (2006.01) |
| ***H01L 41/02*** | (2006.01) |
| ***H01L 41/00*** | (2013.01) |
| ***B41J 2/045*** | (2006.01) |

(52) U.S. Cl.

USPC .............. 347/68; 347/71; 310/311; 310/365; 310/367; 239/102.2

(58) Field of Classification Search

USPC ........... 239/102.2, 4; 29/25.35; 310/311, 357, 310/358, 365, 367; 347/68–72; 252/62.9 R, 252/62.9 PZ

See application file for complete search history.

(56) References Cited

U.S. PATENT DOCUMENTS 5,491,102 A 2/1996 Desu et al.
5,691,752 A * 11/1997 Moynihan et al. ............. 347/68

(Continued)

FOREIGN PATENT DOCUMENTS

CN 1435899 A 8/2003
CN 1893138 A 1/2007

(Continued)

OTHER PUBLICATIONS

Extended European Search Report for European Application No. 09802687.5 dated Apr. 23, 2013.

(Continued)

*Primary Examiner* — Darren W Gorman

(74) *Attorney, Agent, or Firm* — Birch, Stewart, Kolasch & Birch, LLP

(57) ABSTRACT

A piezoelectric device, including the following on a substrate in the order listed below: a lower electrode, a piezoelectric film which contains a Pb containing perovskite oxide represented by a general expression (P) below, and an upper electrode, in which the piezoelectric film has a layer of pyrochlore oxide on the surface facing the lower electrode, and the average layer thickness of the pyrochlore oxide layer is not greater than 20 nm.

$$A_aB_bO_3 \quad (P)$$

where, A: at least one type of A-site element containing Pb as a major component, B: at least one type of B-site element selected from the group consisting of Ti, Zr, V, Nb, Ta, Cr, Mo, W, Mn, Sc, Co, Cu, In, Sn, Ga, Zn, Cd, Fe, and Ni, and O: an oxygen element.

16 Claims, 7 Drawing Sheets

3 15 14 13 12 11 16 1 2 20 21 22

14 13 13p 12 11

(56) References Cited

U.S. PATENT DOCUMENTS

| | | | | |
|---|---|---|---|---|
| 6,051,914 | A | 4/2000 | Nishiwaki | |
| 6,692,651 | B2 * | 2/2004 | Helke | 252/62.9 PZ |
| 6,756,720 | B2 | 6/2004 | Sakai | |
| 6,774,541 | B1 | 8/2004 | Fukui | |
| 7,268,472 | B2 * | 9/2007 | Higuchi et al. | 310/365 |
| 7,511,409 | B2 * | 3/2009 | Yamaguchi et al. | 313/311 |
| 7,589,450 | B2 | 9/2009 | Takabe et al. | |
| 7,845,767 | B2 | 12/2010 | Sakashita et al. | |
| 8,142,678 | B2 | 3/2012 | Matsuda et al. | |
| 2003/0156163 | A1 | 8/2003 | Watanabe et al. | |
| 2004/0036745 | A1 * | 2/2004 | Nishimura | 347/68 |
| 2006/0234395 | A1 | 10/2006 | Kijima | |

FOREIGN PATENT DOCUMENTS

| | | | |
|---|---|---|---|
| CN | 2007-116091 | A | 5/2007 |
| CN | 1956234 | A | 5/2007 |
| EP | 1544927 | A2 | 6/2005 |
| JP | 6-68529 | A | 3/1994 |
| JP | 6-70258 | U | 9/1994 |
| JP | 9-139476 | A | 5/1997 |
| JP | 10-217458 | A | 8/1998 |
| JP | 2003-133605 | A | 5/2003 |
| JP | 2004-87547 | A | 3/2004 |
| JP | 2006-295065 | A | 10/2006 |

OTHER PUBLICATIONS

Japanese Office Action for Japanese Application No. 2008-197456 dated Apr. 9, 2013 (with partial English translation).

Lee et al., "Characterization of a Bismuth-Doped Lead Zirconate Titanate Thin Film Capacitor", Journal of the Korean Physical Society, vol. 31, No. 3, Sep. 1997, pp. 532-536.

Chinese Office for corresponding Chinese Application No. 200980129916.4 dated Dec. 28, 2012 (with English translation).

* cited by examiner

PYROCHLORE OXIDE LAYER
AVERAGE LAYER THICKNESS:11nm

PYROCHLORE OXIDE LAYER
AVERAGE LAYER THICKNESS:60nm

PIEZOELECTRIC DEVICE, PIEZOELECTRIC DEVICE MANUFACTURING METHOD, AND LIQUID DISCHARGE APPARATUS

TECHNICAL FIELD

The present invention relates to a piezoelectric device and manufacturing method thereof, and a liquid discharge apparatus.

BACKGROUND ART

Piezoelectric devices that employ piezoelectric bodies having piezoelectricity in which piezoelectric bodies stretch/contract according to increase/decrease in the intensity of applied electric field are used as actuators mounted on inkjet recording heads, sensors, storage devices, and the like. Recently, in the trend toward high density and high integration of devices, reduction in film thickness of piezoelectric devices has been moved forward and development of piezoelectric devices with piezoelectric films having high piezoelectric properties has been in progress.

As for piezoelectric films having high piezoelectric properties, piezoelectric films of Pb containing perovskite oxide films, such as PZT ($Pb(Zr, Ti)O_3$: lead zirconate titanate) and the like are known. In particular, Pb containing perovskite oxide films which can be formed by vapor growth methods, including sputtering method, receive attention as films having high piezoelectric properties, but still have a problem in durability.

It is known that the durability of a piezoelectric device is restricted by the deterioration in device characteristics due to residual stress in the piezoelectric film, moisture resistance of the film, and the like. The residual stress in a piezoelectric film is likely to cause a crack or a warpage in the piezoelectric film, triggering displacement blockage of the piezoelectric device, film detachment, and the like. Further, under a high humidity environment (in particular, a high temperature and high humidity environment), leakage current of the piezoelectric film is likely to increase due to the presence of water, leading to dielectric breakdown. Still further, the high humidity environment causes ionization of a constituent element of the piezoelectric film which is likely to facilitate ion migration, whereby characteristics of the device are likely to be deteriorated.

For the purpose of improving moisture resistance, methods for preventing ion migration have been studied. Japanese Unexamined Patent Publication No. 2004-087547 discloses a piezoelectric actuator in which Pb composition of the PZT thin film is reduced adjacent to the upper electrode in order to prevent ion migration of the PZT thin film. Further, Japanese Unexamined Patent Publication No. 6(1994)-068529 discloses a ferroelectric device in which a conductive oxide electrode is used as the lower electrode and a Pb containing ferroelectric film is formed on the electrode and heated to form a conductive intermediate layer that includes composition elements of the lower electrode material and ferroelectric material, whereby the composition gradient between the lower electrode and ferroelectric film is reduced.

Both the piezoelectric actuator disclosed in Japanese Unexamined Patent Publication No. 2004-087547 and the ferroelectric device disclosed in Japanese Unexamined Patent Publication No. 6 (1994)-068529 employ a structure in which the composition of the piezoelectric film is changed within the film. If the film composition is changed to that which is different from a composition that may possibly have a perovskite crystal structure, the portion of the film may no longer maintain the perovskite crystal structure, not just changed in the composition. Accordingly, the piezoelectric property is degraded, although the ion migration is prevented.

The present invention has been developed in view of the circumstances described above, and it is an object of the present invention to provide a piezoelectric device which includes a Pb containing perovskite oxide film having an excellent piezoelectric property and durability, and a manufacturing method of the same.

DISCLOSURE OF THE INVENTION

The inventors of the present invention have earnestly studied for solving the problems described above, and have found that, in a piezoelectric device, a layer of pyrochlore oxide is likely to be formed at the interface of the piezoelectric film with the lower electrode and the durability of the piezoelectric device has a correlation with the average layer thickness of the pyrochlore oxide layer.

That is, a piezoelectric device of the present invention is a device, including the following on a substrate in the order listed below: a lower electrode, a piezoelectric film which contains a Pb containing perovskite oxide represented by a general expression (P) below, and an upper electrode, in which the piezoelectric film has a layer of pyrochlore oxide on the surface facing the lower electrode, and the average layer thickness of the pyrochlore oxide layer is not greater than 20 nm. Preferably, the average layer thickness of the pyrochlore oxide layer is not greater than 11 nm.

$$A_aB_bO_3 \quad (P)$$

(where,

A: at least one type of A-site element containing Pb as a major component,

B: at least one type of B-site element selected from the group consisting of Ti, Zr, V, Nb, Ta, Cr, Mo, W, Mn, Sc, Co, Cu, In, Sn, Ga, Zn, Cd, Fe, and Ni, and O: an oxygen element.

Typically, a=1.0 and b=1.0, but these values may deviate from 1.0 within a range in which a perovskite structure can be formed.)

Here, the average layer thickness of the pyrochlore oxide layer is a value calculated in the following manners.

1) Photographing a high-angle annular dark-field scanning transmission electron microscopy (HAADF-STEM) image of a cross-section of the piezoelectric film orthogonal to the surface of the substrate by HAADF-STEM, as an original image.

2) Using the fact that the perovskite oxide layer and pyrochlore oxide layer have different contrasts in the HAADF-STEM image, digitizing the pyrochlore oxide layer with a predetermined threshold value (e.g., if the original image has 255 shades of gray, the threshold value is set to around 100 to 150) using a contrast adjustment function of image processing software, and extracting the digitized image using an edge extraction function of the image processing software. In this case, the threshold value is set such that noise is removed as much as possible and only the layer clearly discriminated as the pyrochlore oxide layer is extracted. When the contour of the pyrochlore oxide layer is not clear in the digitized image, empirically drawing a contour line while looking at the digitized image and filling the inside of the contour.

3) Calculating the area of the extracted pyrochlore oxide layer from the number of pixels of the image processing software, and dividing the area by the visual field width of the HAADF-STEM image to obtain the average layer thickness. In 1) above, the sample for photographing the HAADF- STEM image is processed so as to have a uniform thickness of 100 nm in the depth direction (a direction orthogonal to the observation cross-section). The reason for performing the observation with the HAADF-STEM image is to eliminate the influence of diffraction contrast and to observe the difference in contrast between the perovskite oxide layer and pyrochlore layer arising from the difference in density. The electron beam is incident in a direction perpendicular to the substrate. As for the image processing software, for example, Photoshop may be used. The reason for filling the pyrochlore oxide layer in black is to avoid undervaluation of the area.

The term "major component" as used herein refers to a component of not less than 80 wt %.

Preferably, in the piezoelectric device of the present invention, the A-site element A in the general expression (P) includes at least one type of metal element selected from the group consisting of Bi, Sr, Ba, Ca, and La.

Further, in the piezoelectric device of the present invention, it is preferable that the piezoelectric film is a pillar structure film formed of multiple pillar crystals extending in a direction nonparallel to the surface of the substrate.

A liquid discharge apparatus of the present invention is an apparatus, including the piezoelectric device described above and a liquid discharge member integrally or separately provided on the rear surface of the substrate of the piezoelectric device, in which the liquid discharge member has a liquid storage chamber for storing a liquid and a liquid discharge opening for discharging the liquid from the liquid storage chamber to the outside.

A piezoelectric device manufacturing method of the present invention is a method, including the steps of: providing a substrate having a lower electrode on either one of the surfaces; forming a piezoelectric film which contains a perovskite oxide represented by a general expression (P) below and satisfies a formula (3) below by a sputtering method under conditions that satisfy formulae (1) and (2) below; and forming an upper electrode on the piezoelectric film.

$$400 \leq Ts(°\ C.) \leq 600 \quad (1)$$

$$0.5 < Po_2(\%) \leq 2.2 \quad (2)$$

$$0 \leq Th(nm) \leq 20 \quad (3)$$

(where,
Ts (° C.) is the film forming temperature,
$Po_2$(%) is the oxygen partial pressure, and
Th is the average layer thickness of a pyrochlore oxide layer on the surface of the piezoelectric film on the side of the lower electrode.)

$$A_aB_bO_3 \quad (P)$$

(where,
A: at least one type of A-site element containing Pb as a major component,
B: at least one type of B-site element selected from the group consisting of Ti, Zr, V, Nb, Ta, Cr, Mo, W, Mn, Sc, Co, Cu, In, Sn, Ga, Zn, Cd, Fe, and Ni, and
O: an oxygen element.
Typically, a=1.0 and b=1.0, but these values may deviate from 1.0 within a range in which a perovskite structure can be formed.)

The term "film forming temperature Ts (degrees Celsius)" as used herein refers to the temperature at the center of the substrate on which the film forming is performed.

The present invention is based on the finding of correlation between the durability of a piezoelectric device and the average layer thickness of an interface pyrochlore oxide layer on the surface of the piezoelectric film on the side of the lower electrode, and based on the fining of a structure of a piezoelectric device which is excellent in moisture resistance, less residual stress, and excellent in durability. That is, the piezoelectric device of the present invention has a piezoelectric film of Pb containing perovskite oxide, in which the average layer thickness of an interface pyrochlore oxide layer on the surface of the piezoelectric film on the side of the lower electrode is not greater than 20 nm. According to the present invention, the durability of a piezoelectric device is improved without degrading the piezoelectric property, so that a piezoelectric device having a high piezoelectric property with favorable durability may be provided.

BEST MODE FOR CARRYING OUT THE INVENTION

Piezoelectric Device, Inkjet Recording Head

Figure 1:
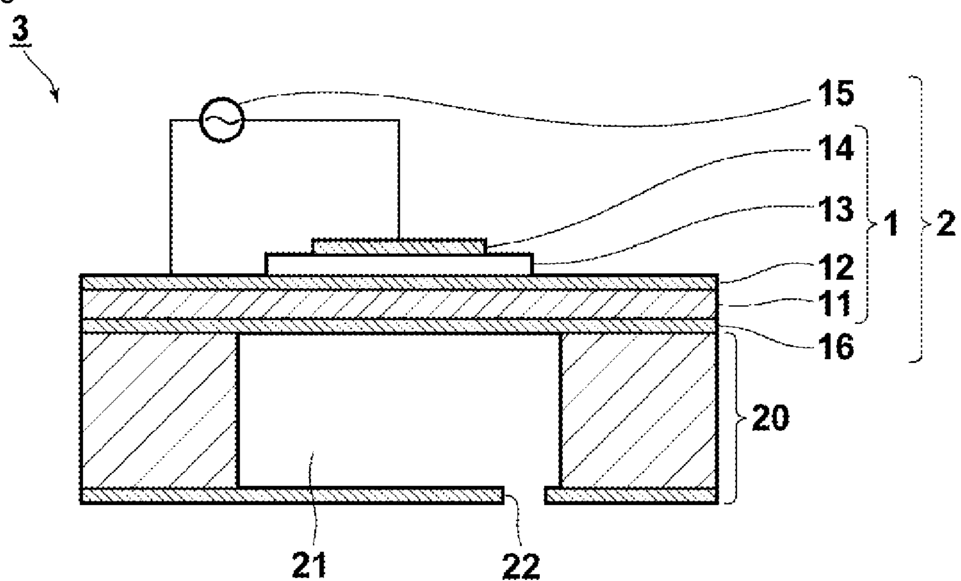
FIG. 1 is a cross-sectional view of a piezoelectric device and an inkjet recording head (liquid discharge apparatus) according to an embodiment of the present invention, illustrating the structure thereof.

The structure of a piezoelectric device and an inkjet recording head according to an embodiment of the present invention will be described with reference to FIG. 1. FIG. 1 is a cross-sectional view of a relevant part of the inkjet recording head. Each of the components is not necessarily drawn to scale for facilitating visibility.

Inkjet recording head (liquid discharge apparatus) 3 according to the present embodiment basically includes an ink nozzle (liquid storage/discharge member) 20, having an ink chamber (liquid storage chamber) 21 for storing an ink and an ink discharge opening 22, attached to the rear surface of piezoelectric actuator 2. In inkjet recording head 3, the electric field applied to piezoelectric device 1 is increased or decreased to cause device 1 to stretch or contract, whereby ink discharge from ink chamber 21 and the amount of the discharge are controlled.

Piezoelectric actuator 2 is constituted by piezoelectric device 1 and vibration plate 16, which is attached to the rear surface of substrate 11 and vibrates with stretching/contraction of piezoelectric film 13.

Instead of attaching vibration plate 16 and ink nozzle 20 made of a separate member to substrate 11, portions of substrate 11 may be formed into vibration plate 16 and ink nozzle 20. For example, where substrate 11 is a laminated substrate, such as a SOI substrate, ink storage chamber 21 may be formed by etching substrate 11 from the rear side, and vibration plate 16 and ink nozzle 20 may be formed by processing the substrate itself.

Piezoelectric device 1 of the present embodiment is a device which includes lower electrode layer 12, piezoelectric film 13, and upper electrode layer 14 stacked on substrate 11 in this order and an electric field is applied in the film thickness direction by lower electrode layer 12 and upper electrode layer 14.

Piezoelectric actuator 2 is a flexural oscillation mode actuator, and lower electrode layer 12 is patterned, with piezoelectric film 13, such that the drive voltage can be changed with respect to each ink chamber 21. Piezoelectric device 1 further includes driver 15 for performing drive control in which application voltage to lower electrode layer 12 is changed.

The inventors of the present invention have noticed that there is a variation in durability among piezoelectric devices having Pb containing perovskite oxide films of the same composition, which have been confirmed to be perovskite single-phase films by XRD crystal structure analysis, due to difference in manufacturing conditions. As a result of investigation into the cause, the inventors of the present invention have found that each piezoelectric film determined to be a perovskite single-phase film by XRD structural analysis has a pyrochlore oxide layer formed at the interface with the lower electrode and that there is a correlation between the average thickness of the pyrochlore oxide layer and durability.

As described under the "Background Art", the durability of a piezoelectric device is influenced largely by the residual stress in the piezoelectric film and moisture resistance of the film. The inventors of the present invention have found that it is possible to reduce the residual stress in a piezoelectric film and to ensure a durability life of not less than 10 billion cycle, which is the target durability for practical use, even under high temperature and high humidity conditions (Example 1, to be described later) by limiting the average thickness of the pyrochlore oxide layer to 20 nm or less.

The term "durability life" is defined as the number of driven times (cycles) of a piezoelectric device when the dielectric loss tangent reaches 20% when a trapezoidal wave of 50 kV/cm with a frequency of 10 kHz is applied under a temperature of 40 degrees Celsius and a humidity of 85%.

Figure 2:
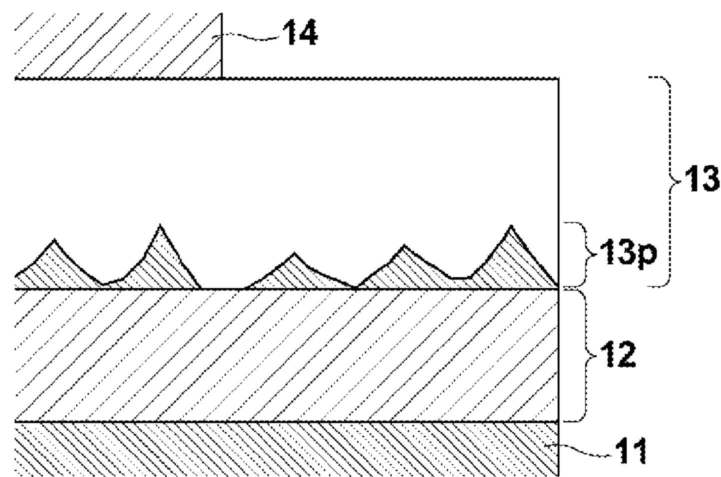
FIG. 2 is a partial enlarged view of the piezoelectric device shown in FIG. 1 illustrating a portion adjacent to the interface between the lower electrode and piezoelectric film.

That is, as shown in FIG. 2, in piezoelectric device 1, pyrochlore oxide layer 13*p* is formed in piezoelectric film 13 at the interface with lower electrode layer 12, and average layer thickness Th of pyrochlore oxide layer 13*p* is limited to 20 nm or less.

FIG. 2 is a partial enlarged view the piezoelectric device shown in FIG. 1, illustrating a portion adjacent to the interface between piezoelectric film 13 and lower electrode layer 12.

In piezoelectric device 1 of the present embodiment, there is not a specific limitation on substrate 11, and substrates of silicon, glass, stainless (SUS), yttrium-stabilized zirconia (YSZ), $SrTiO_3$, alumina, sapphire, silicon carbide, and the like are preferably used. Further, as substrate 11, a laminated substrate, such as a SOI substrate made of a silicon substrate with $SiO_2$ film and a Si active layer stacked on the substrate in this order, may also be used. Further, a buffer layer for improving lattice matching or contact layer for improving adhesion between the electrode and substrate may be provided.

There is not a specific limitation on the major component of lower electrode 12, and a metal, such as Au, Pt, Ir, $IrO_2$, $RuO_2$, $LaNiO_3$, or $SrRuO_3$, a metal oxide, or a combination thereof may be used. There is not a specific limitation on the major component of upper electrode 14, and materials cited in lower electrode 12, materials generally used in semiconductor processing, such as Al, Ta, Cr, or Cu, or a combination thereof may be used.

There is not a specific limitation on the thicknesses of lower electrode 12 and upper electrode 14 and is preferable to be in the range from 50 to 500 nm.

Preferably, piezoelectric film 13 is formed of one or more types of perovskite oxides represented by the general expression (P) below, in which B-site element B includes Ti and Zr, and A-site element A includes at least one type of metal element selected from the group consisting of Bi, Sr, Ba, Ca, and La.

$$A_aB_bO_3 \quad (P)$$

(where,

A: at least one type of A-site element containing Pb as a major component,

B: at least one type of B-site element selected from the group consisting of Ti, Zr, V, Nb, Ta, Cr, Mo, W, Mn, Sc, Co, Cu, In, Sn, Ga, Zn, Cd, Fe, and Ni, and O: an oxygen element.

Typically, a=1.0 and b=1.0, but these values may deviate from 1.0 within a range in which a perovskite structure can be formed.)

Perovskite oxides represented by the general expression (P) above include lead titanate, lead zirconate titanate (PZT), lead zirconate, lead lanthanum titanate, lead lanthanum zirconate titanate, lead magnesium niobate zirconate titanium, lead nickel niobate zirconate titanium, and the like. Piezoelectric film 13 may be a mixed crystal system of those represented by the general expression (P) above.

Preferably, piezoelectric film 13 has a pillar structure formed of multiple pillar crystals extending in a direction nonparallel to the surface of the substrate, since the film can provide a high piezoelectric performance. The film structure of multiple pillar crystals extending in a direction nonparallel to the surface of the substrate will result in an oriented film in which crystal orientations are aligned. Such film structure may be obtained when the film is formed by a nonthermal equilibrium process, such as a sputtering method, or the like.

Piezoelectric strains include the following:

(1) an ordinary electric-field induced strain in which stretch or contraction occurs in a direction of applied electric field according to the increase or decrease in applied electric field intensity when the vector component of spontaneous polarization axis corresponds to the direction of applied electric field;

(2) a piezoelectric strain produced by increasing or decreasing the electric field intensity and reversibly rotating the polarization axis by non-180 degrees;

(3) a piezoelectric strain caused by the change in volume due to crystal phase transitions induced by the increase or decrease in the electric field intensity; and (4) a piezoelectric strain that makes use of engineered domain effect, which is capable of providing a larger strain, obtained by using a material having a property to cause phase transitions by the application of an electric field and forming a crystal orientation structure containing a ferroelectric phase having crystal orientation in a direction different from the spontaneous polarization direction (when making use of the engineered domain effect, the piezoelectric body may be driven under the condition in which phase transitions occur or under the condition in which phase transitions do not occur).

The use of the piezoelectric strains (1) to (4) individually or in combination allows a desired piezoelectric strain to be obtained. In each of the piezoelectric strains (1) to (4), a larger piezoelectric strain may be obtained by forming a crystal orientation structure according to the strain generation mechanism. Thus, in order to obtain a high piezoelectric performance, it is preferable that the piezoelectric film has a crystal orientation. For example, if it is a PZT system ferroelectric film of MPB composition, a pillar crystal film of (100) orientation may be obtained.

The growth direction of the pillar crystal may be any direction as long as it is non-parallel to the substrate surface, and it may be, for example, a direction substantially perpendicular or oblique to the substrate surface. The average pillar diameter of the multiple pillar crystals forming the piezoelectric film does not have a specific limitation, but preferably in the range from 30 nm to 1 micro meter. An excessively small average pillar diameter will result in insufficient crystal growth for a piezoelectric film and desired ferroelectric performance (piezoelectric performance) may not be obtained, while an excessively large average pillar diameter may result in degraded shape accuracy after patterning.

In piezoelectric film 13, when the vector component of spontaneous polarization axis corresponds to the direction of applied electric field, the stretch or contraction occurs effectively in the direction of applied electric field according to the increase or decrease in applied electric field intensity, whereby the piezoelectric effect due to electric-field induced strain may be obtained effectively. Therefore, a film having a less variation in crystal orientation in the spontaneous polarization axis direction is preferable as piezoelectric film 13.

There is not a specific limitation on the crystal structure of piezoelectric film 13, and for a PZT system, a tetragonal system, a rhombohedral system, and a mixed system thereof may be cited. For example, if it is a $Pb(Zr_{0.52}Ti_{0.48})O_3$ of MPB composition, a tetragonal solitary crystal structure, a mixed crystal structure of tetragonal and rhombohedral crystals, or a rhombohedral solitary crystal structure is obtained depending on the film forming condition.

There is not a specific limitation on the film thickness of piezoelectric film 13 as long as a desired amount of displacement is obtainable, but is preferable to be not less than 500 nm and more preferable to be in the range from 2 to 5 micro meters.

As described above, average layer thickness Th of pyrochlore oxide layer 13*p* in piezoelectric film 13 is limited to not greater than 20 nm. When an electric field is applied to piezoelectric film 13, the electric field and stress are likely to be concentrated adjacent to pyrochlore layer 13*p* at the interface of piezoelectric film 13 with lower electrode layer 12, causing a crack or a warpage in the film that triggers displacement blockage of the piezoelectric device, film detachment, and the like. In addition, as the amount of pyrochlore layer 13*p* increases, so does the number of high electric field points adjacent to the interface of piezoelectric film 13 with an underlayer (lower electrode layer 12), which is thought to facilitate ion migration and degrade moisture resistance of the film. Therefore, average layer thickness Th is preferable to be as small a value as possible, for example, not greater than 11 nm. Ideally, average layer thickness Th is preferable to be zero.

It has been known that absence of pyrochlore oxide in piezoelectric film 13 is preferable for piezoelectric property. Many Pb containing oxide films confirmed to be perovskite single-phase films without a pyrochlore oxide by XRD crystal analysis are reported. However, the inventors of the present invention have confirmed for the first time that the film confirmed to be a perovskite single-phase film by XRD structural analysis includes a pyrochlore oxide layer adjacent to the interface with an underlayer, such as the substrate, electrode, and the like, and also that the average layer thickness of the pyrochlore oxide layer adjacent to the interface influences to the durability of the piezoelectric device, as well as piezoelectric property. So far, no report describing the direct correlation between a layer of pyrochlore oxide at the interface of a piezoelectric film with the lower electrode and durability has been found.

Further, the inventors of the present invention have confirmed that, when forming a film, oxygen and Pb are likely to diffuse into an underlayer near the interface of the film with the underlayer, so that a pyrochlore layer is more likely to be formed adjacent to the interface in comparison with the surface or inside of the film. That is, although it is not clear, for Pb containing oxide films regarded as perovskite single-phase films, whether or not a pyrochlore oxide layer is present at the interface of the film with an underlayer, it may well be thought that it is present and the average layer thickness exceeds 20 nm given the conventional manufacturing methods and manufacturing conditions. Therefore, the structure in which average layer thickness Th of pyrochlore oxide layer 13*p* present at the interface of piezoelectric film 13 with lower electrode layer 12 of piezoelectric device 1 is limited to not greater than 20 nm is novel.

As described above, in piezoelectric device 1, the average layer thickness of a pyrochlore oxide layer adjacent to the interface of piezoelectric film 13 with an underlayer is limited to not greater than 20 nm to improve the residual stress and moisture resistance, thereby improving the durability. Accordingly, piezoelectric device 1 has a less amount of pyrochlore oxide in piezoelectric film 13. As described above, it is preferable, for piezoelectric property, that a piezoelectric device has a less amount of pyrochlore oxide, so that piezoelectric device 1 has a favorable durability and a favorable piezoelectric property.

An example method for manufacturing piezoelectric device 1 will now be described. First, substrate 11 is provided and lower electrode layer 12 is formed on substrate 11. A buffer layer or a contact layer may be formed, as required, before lower electrode layer 12 is formed. Next, piezoelectric layer 13 is formed on lower electrode layer 12, and then piezoelectric layer 13 is patterned so as to be driven with respect to each ink chamber 21. Further, upper electrode layer 14 is formed on patterned piezoelectric film 13, and then driver 15 and necessary wiring are formed, whereby piezoelectric device 1 is obtained.

There is not a specific limitation on the film forming method for forming piezoelectric film 13, lower electrode layer 12, and upper electrode layer 14, and a vapor growth method using plasma, such as sputtering method, ion plating method, plasma CVD method, pulse laser deposition method, or the like, an ion beam sputtering method, or the like may be used. Piezoelectric film 13 may have a pillar crystal structure when formed by a nonthermal equilibrium process, such as a sputtering method. When forming piezoelectric film 13 by a sputtering method, piezoelectric film 13 that satisfies formula (3) below may be formed by performing the film forming under the conditions that satisfy formulae (1) and (2) below.

$$400 \leq Ts(°\ C.) \leq 600 \quad (1)$$

$$0.5 < Po_2(\%) \leq 2.2 \quad (2)$$

$$0 \leq Th(nm) \leq 20 \quad (3)$$

(where,

Ts (° C.) is the film forming temperature, $Po_2$(%) is the oxygen partial pressure, and Th is the average layer thickness of a pyrochlore oxide layer on the surface of the piezoelectric film on the side of the lower electrode.)

In the film formation by the sputtering method described above, it is difficult to stably grow perovskite crystals under film forming temperature Ts lower than 400 degrees Celsius. In addition, for piezoelectric film 13 of a Pb containing material, such as a PZT system or the like, if the film forming is performed at a high temperature exceeding 600 degrees Celsius, Pb dropout is likely to occur. Further, regardless of whether the material is Pb containing material or not, if the film forming is performed at a high temperature exceeding 600 degrees Celsius, piezoelectric film 13 has stress due to the difference in thermal expansion coefficient between substrate 11 and piezoelectric film 13 during the film forming process, a cooling process after the film forming process, and the like, whereby a crack and the like may possibly occur. Such temperature condition is applicable to other vapor growth methods than the sputtering method.

In the mean time, the inventors of the present invention have confirmed that a pyrochlore oxide layer is more likely to be formed at the interface of a piezoelectric film with an underlayer than the inside of the film due to the influence of dissipation of oxygen and Pb into the underlayer, as described earlier. In addition to the temperature condition described above, if a film is formed under a condition that prevents the dissipation of oxygen and Pb into an underlayer, for example, reducing oxygen flow rate in a sputtering method, i.e., under a condition that satisfies the formula (2) above, the formation of a pyrochlore oxide layer adjacent to the interface of the piezoelectric film with the underlayer is restricted, whereby piezoelectric film 13 that satisfies the formula (3) above may be formed.

In the sputtering method that uses plasma, when forming piezoelectric film 13, if the film forming is performed under the condition in which Vs−Vf, which is the difference between plasma potential Vs (V) in the plasma and floating potential Vf (V) during the film forming, is set to 10 to 35V, perovskite crystals may be stably grown with less amount of pyrochlore oxide in the film and Pb dropping may stably be prevented, whereby a quality piezoelectric film having a favorable crystal structure and a film composition may be formed stably.

Here, "plasma potential Vs and floating potential Vf" are to be measured by the single probe method using a Langmuir probe. The measurement of floating potential Vf is performed within a time as short as possible by placing the tip of the probe near the substrate (about 10 mm away from the substrate) in order to prevent measurement error caused by the adhesion of a film being formed or the like to the probe. The potential difference between plasma potential Vs and floating potential Vf, Vs−Vf (V) may be directly convert to electron temperature (eV), in which 1 eV corresponds to 11600 K (K is the absolute temperature), 1 eV=11600 K.

In the manufacturing process of a piezoelectric device, if a crack or a warpage occurs in the piezoelectric film, a process following the film forming becomes difficult, causing a degraded yield rate. Piezoelectric device 1 has low residual stress in piezoelectric film 13 so that the manufacturing process of the device becomes easy with a high yield rate.

Piezoelectric device 1 includes piezoelectric film 13 of Pb containing perovskite oxide, and average layer thickness Th of pyrochlore oxide layer 13*p* at the interface of piezoelectric film 13 on the side of lower electrode 12 is limited to not greater than 20 nm. According to the present embodiment, the durability may be improved without degrading piezoelectric property, so that piezoelectric device 1 having a favorable piezoelectric property and a favorable durability may be provided.

Inkjet Recorder

Figure 3:
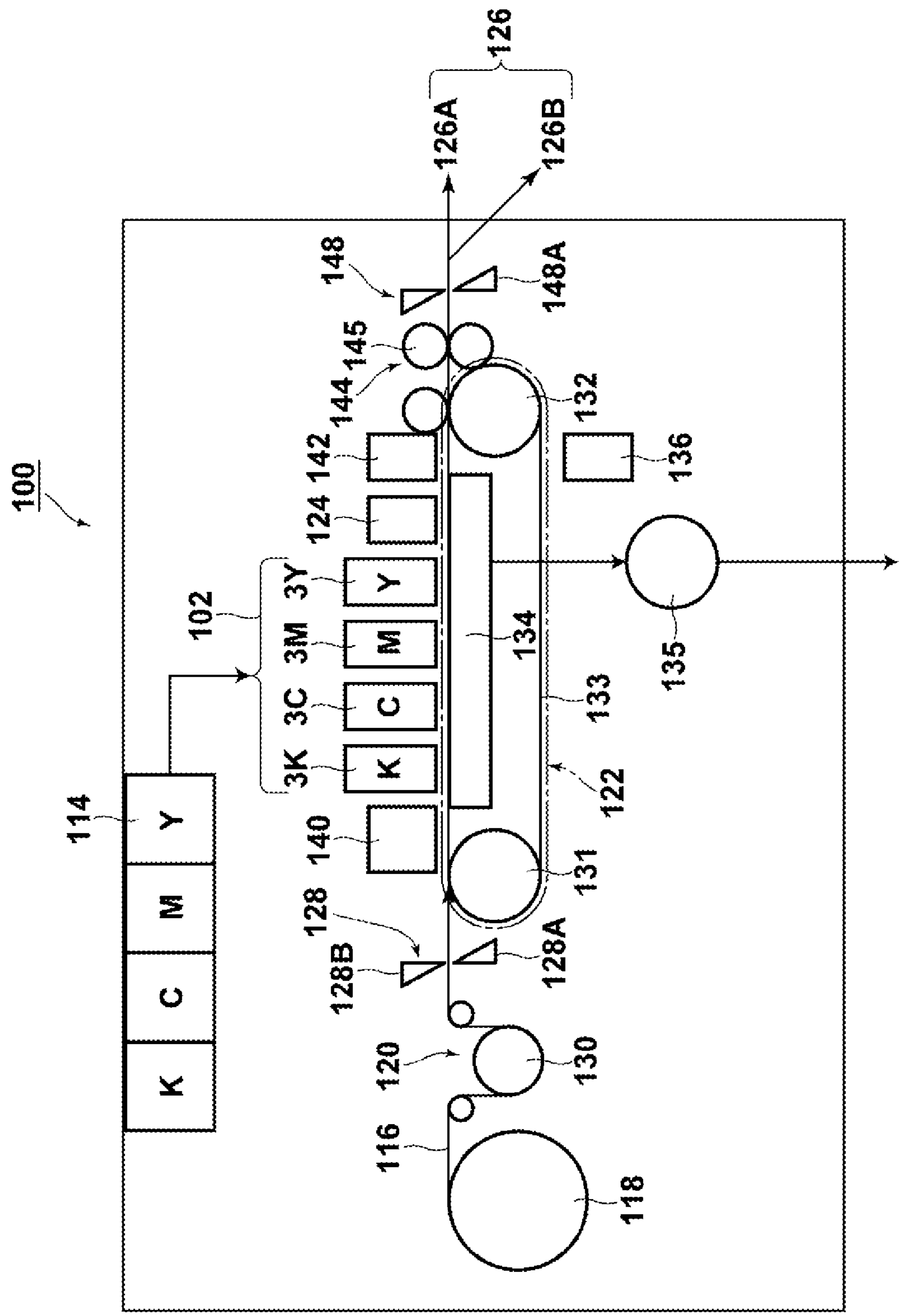
FIG. 3 illustrates an example configuration of an inkjet recorder having the inkjet recording head (liquid discharge apparatus) shown in FIG. 1.
Figure 4:
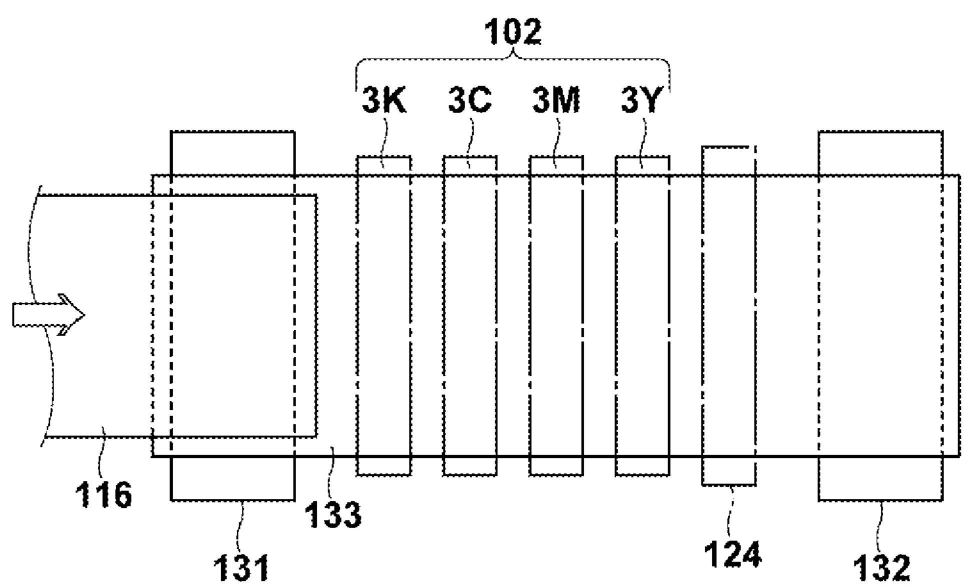
FIG. 4 is a partial top view of the inkjet recorder shown in FIG. 3.

An example configuration of an inkjet recorder having an inkjet recording head 3 according to the embodiment described above will be described with reference to FIGS. 3 and 4. FIG. 3 is an overall view and FIG. 4 is a partial top view of the recorder.

Illustrated inkjet recorder 100 basically includes print section 102 having a plurality of inkjet recording heads (hereinafter, simply "heads" or "head") 3K, 3C, 3M, and 3Y, each for each ink color, ink storage/mount section 114 for storing inks to be supplied to each of heads 3K, 3C, 3M, and 3Y, paper feed section 118 for feeding recording paper 116, decurling section 120 for decurling recording paper 116, suction belt conveyor 122, disposed opposite to the nozzle surface (discharge surface) of print section 102, for conveying recording paper 116 while maintaining flatness of recording paper 116, print detection section 124 for reading a result of printing performed by print section 102, and paper discharge section 126 for discharging a printed paper (printed material) to the outside.

Each of Heads 3K, 3C, 3M, and 3Y constituting print section 102 corresponds to inkjet recording head 3 according to the embodiment described above.

In decurling section 120, recording paper 116 is decurled by heating with heating drum 130 in the direction opposite to the curled direction of recording paper 116 wound on a roll.

For the recorder that uses a roll paper, cutter 128 for cutting the roll paper is provided at a latter stage of decurling section 120, as illustrated in FIG. 4, and the roll paper is cut out to a desired size. Cutter 128 includes fixed blade 128A having a length greater than the width of the conveyor path and round blade 128B that moves along fixed blade 128A, in which fixed blade 128A is provided on the rear side of the printing surface and round blade 128B is provided on the printing surface side across the conveyor path. The recorder that uses a cut sheet does not require cutter 128.

Decurled and cutout recording paper 116 is fed to suction belt conveyor 122. Suction belt conveyor 122 includes rollers 131, 132, and endless belt 133 wound between them, and configured such that at least the portion opposite to the nozzle surface of print section 102 and the sensor surface of print detection section 124 becomes a level plane (flat plane).

Belt 133 has a width greater than that of recording paper 116 and many suction holes (not shown) are formed in the belt face. Suction chamber 134 is provided at the position opposite to the nozzle surface of print section 102 and the sensor surface of print detection section 124 in the inner side of belt 133 wound between rollers 131, 132. Suction chamber 134 is suctioned by fan 135 so as to have a negative pressure, thereby suction-holding recording paper 116 on belt 133.

Power is supplied to at least either one of rollers 131, 132 from a motor (not shown), whereby belt 133 is driven in clockwise direction in FIG. 4 and recording paper 116 held on belt 133 is conveyed from left to right in FIG. 4.

When a borderless print or the like is printed, the ink adheres also to belt 133, so that belt cleaning section 136 is provided at a predetermined position (appropriate position other than the printing area) on the outer side of belt 133.

Heating fan 140 is provided on the upstream side of print section 102 on the paper conveyer path formed by suction belt conveyor 122. Heating fan 140 blows heated air onto recording paper 116 before printing to heat recording paper 116. By heating recording paper 116 immediately preceding the printing, spotted inks on recording paper 116 are dried faster.

Print section 102 is a so-called full line head in which line heads having a length corresponding to a maximum paper width are disposed in a direction (main scanning direction) orthogonal to the paper feed direction (FIG. 4). Each of printing heads 3K, 3C, 3M, and 3Y is a line head having a plurality of ink discharge openings (nozzles) disposed over a length which exceeds at least one side of maximum size of recording paper 116.

Heads 3K, 3C, 3M, and 3Y corresponding to black (K), cyan (C), magenta (M), and yellow (Y) are disposed in this order from the upstream side along the paper feed direction of recording paper 116. A color image is recorded on recording paper 116 while being conveyed by discharging a color ink from each of heads 3K, 3C, 3M, and 3Y.

Print detection section 124 is constituted by a line sensor or the like for imaging inkjet results of print section 102 to detect an inkjet fault, such as clogging of a nozzle, from the obtained inkjet image.

Post drying section 142 constituted by a heating fan or the like for drying the printed image surface is provided at the latter stage of print detection section 124. It is desirable that the printed surface avoids any contact until the inks are dried, so that a method of blowing heated air is preferable.

Heating/pressing section 144 for controlling the glossiness of an image surface is provided at the latter stage of post drying section 142. In heating/pressing section 144, the image surface is pressed, while being heated, by pressing rollers 145 having a predetermined uneven surface shape to transfer the uneven shape to the image surface.

The printed material obtained in the manner described above is discharged from paper discharge section 126. Preferably, an intended print (print on which an intended image is printed) and a test print are discharged separately. Inkjet recorder 100 includes a selection means (not shown) for selecting and switching paper discharge paths between intended prints and test prints to send them discharge section 126A and 126B respectively. Where an intended image and a test image are printed on a large paper in parallel at the same time, cutter 148 may be provided to separate the test print portion. Inkjet recorder 100 is structured in the manner as described above.

(Design Change)

The present invention is not limited to the embodiment described above, and may be changed in design without departing from the spirit of the present invention.

EXAMPLES

Examples and Comparative Examples according to the present invention will now be described.

Example 1

As the film forming substrate, a substrate with an electrode was provided by sequentially forming a Ti contract layer of 30 nm and a Pt lower electrode layer of 150 nm on a Si wafer. Then, a piezoelectric film (film thickness of 5 micro meters) of PZT was formed by a RF sputtering system using a target of $Pb_{1.3}Zr_{0.52}Ti_{0.48}O_3$, as Sample A, under the following conditions: film forming temperature 525 degrees Celsius, application voltage to target 2.5 W/cm$^2$, distance between the substrate and target 60 mm, degree of vacuum 0.5 Pa, and $Ar/O_2$ mixed atmosphere ($O_2$ partial pressure 1.3%).

Figure 5:
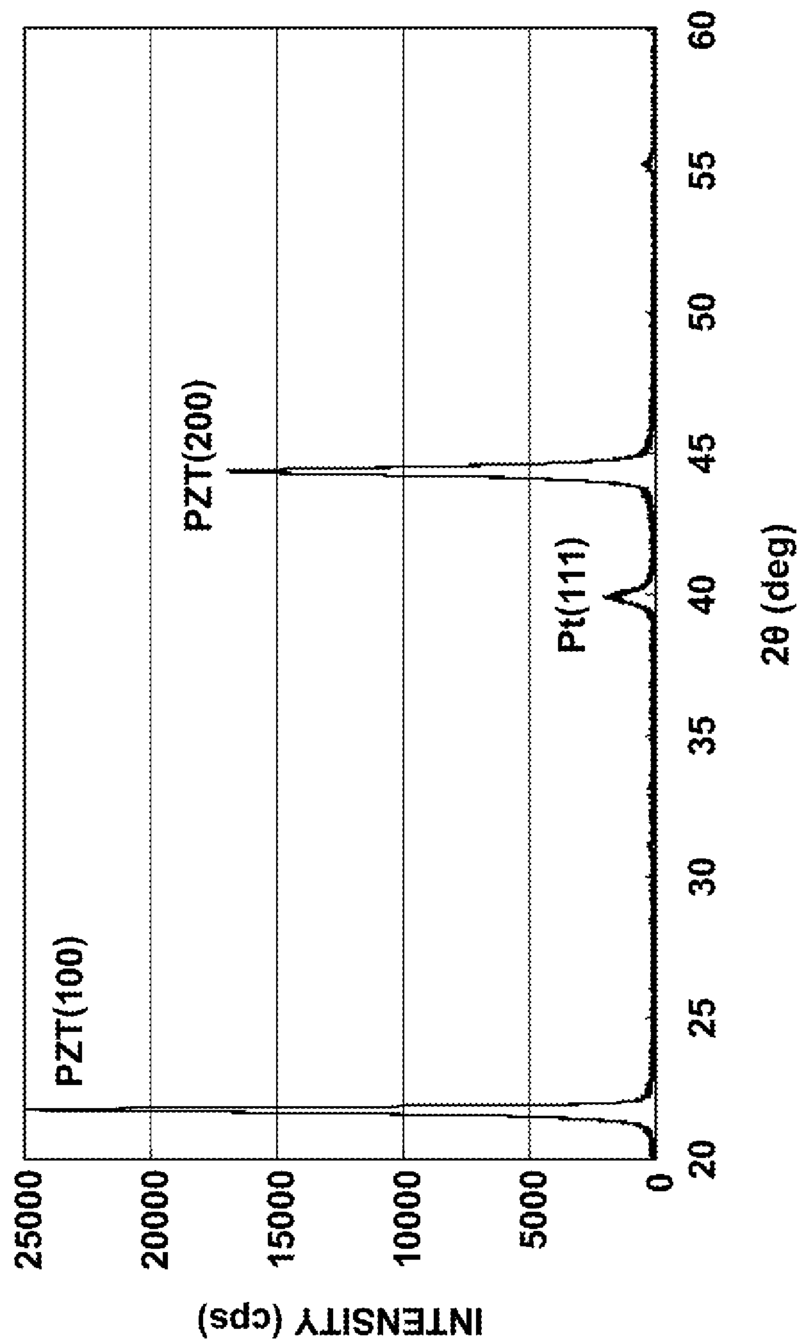
FIG. 5 is a graph illustrating XRD measurement results of Example 1.

X-ray diffraction (XRD) measurements were performed on the PZT film of Sample A, and the film was confirmed to be a perovskite single-phase film, as shown in FIG. 5.

Then, a pyrochlore oxide layer at the interface of the PZT film of Sample A with the lower electrode layer was observed by HAADF-STEM. When performing the observation, Sample A was processed by a FIB (focused ion beam) system so as to have a thickness of 100 nm in depth direction (a direction orthogonal to the cross-section for the observation). The incident direction of the electron beam was <110> orthogonal to the Si substrate surface (100), with an electron accelerating voltage of 200 kV.

Figures 6A, 6B:
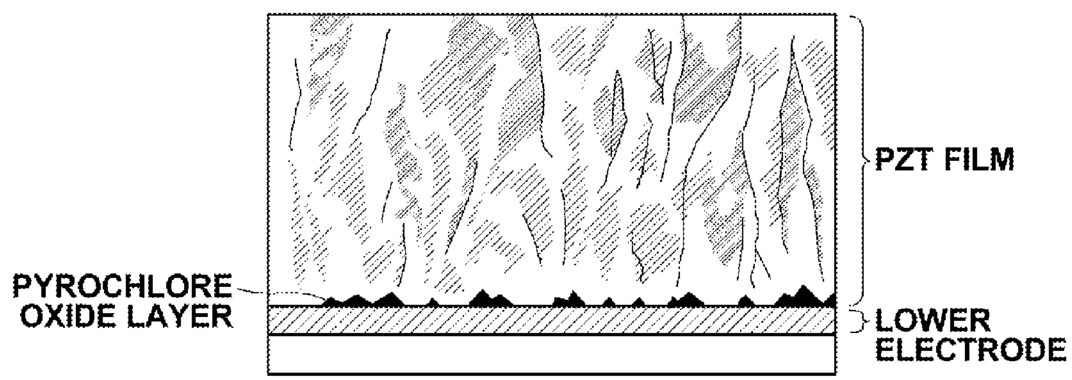
FIG. 6A is a cross-sectional TEM sketch of Sample A of Example 1.
FIG. 6B illustrates a pattern extracted from the TEM image shown in FIG. 6A by digitizing the interfacial pyrochlore oxide layer by image processing.

A sketch of the observed cross-sectional TEM image is shown in FIG. 6A. In FIG. 6A, the black portion at the interface of the PZT film with the lower electrode layer is a pyrochlore oxide layer.

The obtained TEM image was processed to digitize and extract the pyrochlore oxide layer (FIG. 6B). Then, average layer thickness Th of the pyrochlore oxide layer was calculated by dividing the area of the extracted pyrochlore oxide layer (2.6 times $10^4$ nm$^2$) by the visual field width of the TEM image (2.4 times $10^3$ nm), the result of which was, Th=11 nm.

Then, the film stress of Sample A was evaluated. The curvature radius of the substrate before forming the PZT film and the curvature radius of the substrate after forming the PZT film and before cutting out the TEM image sample were measured and the values were substituted in Stoney's equation to calculate the film stress of Sample A, the result of which was about 100 MPa. Stoney's equation is shown below.

$$\sigma = \frac{1}{6}\left(\frac{1}{r_2} - \frac{1}{r_1}\right)\frac{Et^2}{(1-\upsilon)d}$$

(where,

σ is the film stress (Pa), $r_1$ is the curvature radius of the substrate before the film forming (m), $r_2$ is the curvature radius of the substrate after the film forming (m), E is the Young's modulus, ν the Poisson ratio of the substrate, t is the thickness of the substrate, and d is the film thickness of the PZT film.)

Then an upper electrode layer (50 nm of Ti and 200 nm of Pt, a circular shape with a diameter of 1000 micro meters) was formed for Sample A to measure the durability of Sample A under high temperature and high humidity conditions. A trapezoidal wave of 50 kV/cm with a frequency of 10 kHz is applied to Sample A under a temperature of 40 degrees Celsius and a humidity of 85% and the number of driven times (cycles) when the dielectric loss tangent reached 20% was measured, the result of which was 30 billion cycles.

Comparative Example 1

A PZT film was formed on a substrate provided with an electrode under the same conditions as Example 1 except that the oxygen partial pressure was set to 2.7%, as Sample B.

Figure 7:
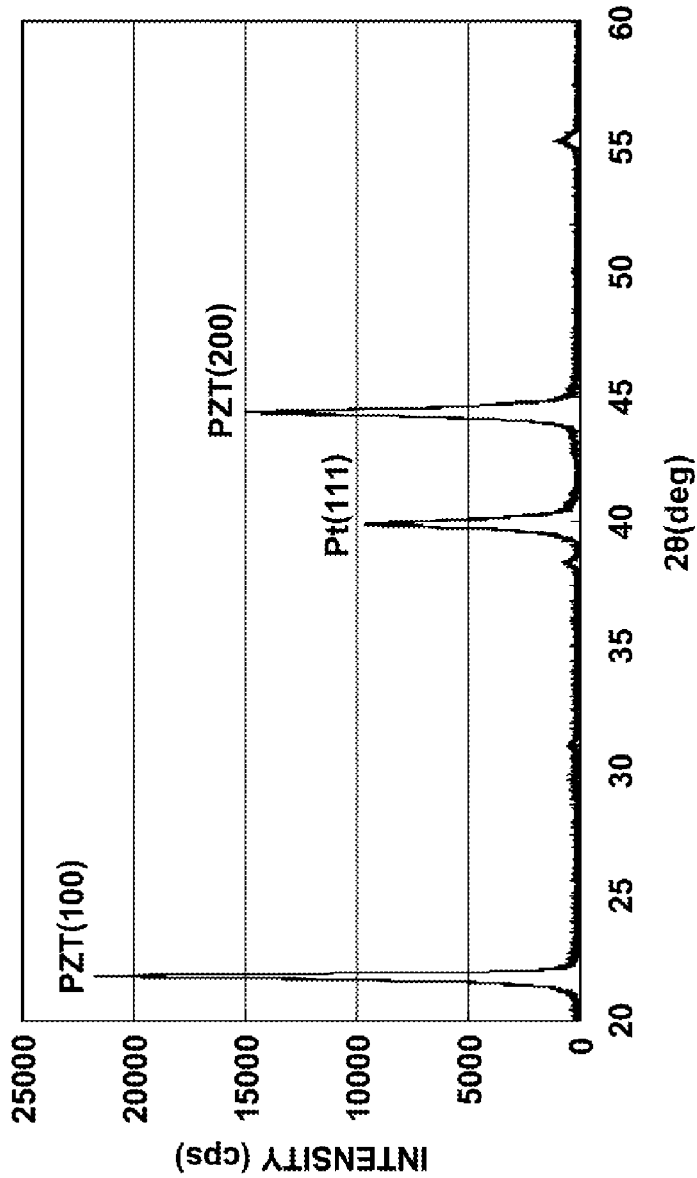
FIG. 7 is a graph illustrating XRD measurement results of Comparative Example 1.

An X-ray diffraction (XRD) measurement was performed on the PZT film of Sample B, and the film was confirmed to be a perovskite single-phase film, as shown in FIG. 7.

Figure 8A:
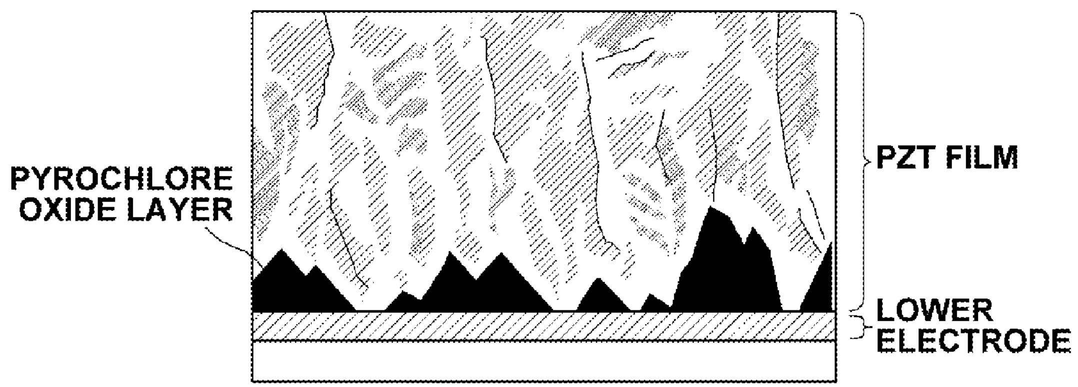
FIG. 8A is a cross-sectional TEM sketch of Sample B of Comparative Example 1.

Then, as in Example 1, a pyrochlore oxide layer at the interface of the PZT film of Sample B with the lower electrode layer was observed by HAADF-STEM. A sketch of the observed cross-sectional TEM image is shown in FIG. 8A. Also in FIG. 8A, the black portion at the interface of the PZT film with the lower electrode layer is a pyrochlore oxide layer.

Figures 8B, 9:
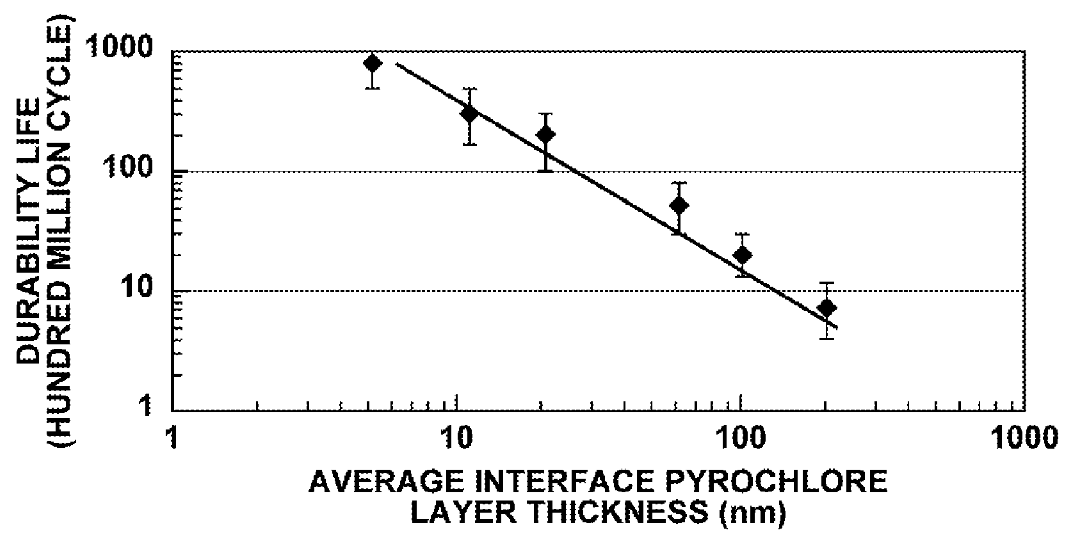
FIG. 8B illustrates a pattern extracted from the TEM image shown in FIG. 8A by digitizing the interfacial pyrochlore oxide layer by image processing.
FIG. 9 is a graph illustrating the relationship between the average layer thickness and durability life.

The obtained TEM image was processed to digitize and extract the pyrochlore oxide layer (FIG. 8B). Then, average layer thickness Th of the pyrochlore oxide layer was calculated by dividing the area of the extracted pyrochlore oxide layer (14.4 times $10^4$ $nm^2$) by the visual field width of the TEM image (2.4 times $10^3$ nm), the result of which was, Th=60 nm.

Then, the film stress of Sample B was evaluated in the same manner as in Example 1, the result of which was about 200 MPa.

Thereafter, the durability of Sample B was measured under high temperature and high humidity conditions in the same manner as in Example 1, the result of which was 5 billion cycles.

(Evaluation)

From the results of Example 1 and Comparative Example 1, it has been known that the average film thickness of the pyrochlore oxide layer at the interface of the PZT film with the lower electrode can be changed by changing the oxygen flow rate. The film stress of Sample A (Example 1) having the small average thickness of the interface pyrochlore oxide layer was half that of Sample B (Comparative Example 1) having the large average thickness of the interface pyrochlore oxide layer, showing that the film stress can be reduced effectively by reducing the average layer thickness of the interface pyrochlore oxide layer. Further, with respect to the durability, Example 1 realized 30 billion cycles which is far exceeding the target durability for practical use, while that of Comparative Example 1 was 5 billion cycles which falls short of the practical level.

Example 2

A PZT film was formed on a Si substrate with an electrode in the same manner as Example 1 except that the oxygen partial pressure was set to 0.5, 2.2, 3.5, and 4.5% to examine the correlation between the average layer thickness of the interface pyrochlore oxide layer and durability life. Average layer thicknesses Th of pyrochlore oxide layers of the obtained four samples were 5 nm, 20 nm, 100 nm, and 200 nm in the ascending order of oxygen flow rate at the time of film forming.

Durability life measurements were performed in the same manner as in Example 1, the results of which are shown in FIG. 9. As shown in FIG. 9, the relationship between the average layer thickness of the interface pyrochlore oxide layer and durability life is substantially linear, and it has been confirmed that a piezoelectric device having a durability life of not less than the target durability for practical use of 10 billion cycles may be realized if the average layer thickness of the interface pyrochlore oxide layer is not greater than 20 nm.

INDUSTRIAL APPLICABILITY

The present invention is preferably applied to actuators mounted on inkjet recording heads, magnetic read/write heads, MEMS (micro electro-mechanical systems) devices, micropumps, or ultrasonic probes, vibration plates, and the like.

The invention claimed is:

1. A piezoelectric device, comprising the following on a substrate in the order listed below: a lower electrode, a piezoelectric film which contains a Pb containing perovskite oxide represented by a general expression (P) below, and an upper electrode, wherein:

the piezoelectric film has a layer of pyrochlore oxide on the surface facing the lower electrode; and the average layer thickness of the pyrochlore oxide layer is not greater than 20 nm, and $$A_aB_bO_3 \quad (P)$$

where,

A: at least one type of A-site element containing Pb as a major component,

B: at least one type of B-site element selected from the group consisting of Ti, Zr, V, Nb, Ta, Cr, Mo, W, Mn, Sc, Co, Cu, In, Sn, Ga, Zn, Cd, Fe, and Ni, and O: an oxygen element, and a=1.0 and b=1.0 or the values of a and b may deviate from 1.0 within a range in which a perovskite structure can be formed.

2. The piezoelectric device of claim 1, wherein the B-site element in the general expression (P) includes Zr and Ti.

3. The piezoelectric device of claim 2, wherein the piezoelectric film is a film with (100) preferred orientation.

4. The piezoelectric device of claim 1, wherein the A-site element in the general expression (P) includes at least one type of metal element selected from the group consisting of Bi, Sr, Ba, Ca, and La.

5. The piezoelectric device of claim 2, wherein the A-site element in the general expression (P) includes at least one type of metal element selected from the group consisting of Bi, Sr, Ba, Ca, and La.

6. The piezoelectric device of claim 1, wherein the piezoelectric film is a pillar structure film formed of multiple pillar crystals extending in a direction nonparallel to the surface of the substrate.

7. The piezoelectric device of claim 2, wherein the piezoelectric film is a pillar structure film formed of multiple pillar crystals extending in a direction nonparallel to the surface of the substrate.

8. The piezoelectric device of claim 3, wherein the piezoelectric film is a pillar structure film formed of multiple pillar crystals extending in a direction nonparallel to the surface of the substrate.

9. The piezoelectric device of claim 4, wherein the piezoelectric film is a pillar structure film formed of multiple pillar crystals extending in a direction nonparallel to the surface of the substrate.

10. The piezoelectric device of claim 5, wherein the piezoelectric film is a pillar structure film formed of multiple pillar crystals extending in a direction nonparallel to the surface of the substrate.

11. The piezoelectric device of claim 1, wherein the piezoelectric film is formed by a sputtering method.

12. The piezoelectric device of claim 1, wherein the average layer thickness of the pyrochlore oxide layer is not greater than 11 nm.

13. The piezoelectric device of claim 2, wherein the average layer thickness of the pyrochlore oxide layer is not greater than 11 nm.

14. The piezoelectric device of claim 6, wherein the average layer thickness of the pyrochlore oxide layer is not greater than 11 nm.

15. The piezoelectric device of claim 7, wherein the average layer thickness of the pyrochlore oxide layer is not greater than 11 nm.

16. A liquid discharge apparatus, comprising:

the piezoelectric device of claim 1; and a liquid discharge member integrally or separately provided on the rear surface of the substrate of the piezoelectric device, wherein the liquid discharge member has a liquid storage chamber for storing a liquid and a liquid discharge opening for discharging the liquid from the liquid storage chamber to the outside.

* * * * *